(12) United States Patent
Yang

(10) Patent No.: US 11,664,513 B2
(45) Date of Patent: May 30, 2023

(54) SYSTEM AND METHOD FOR SENSING FUEL CELL OF VEHICLE

(71) Applicant: HYUNDAI MOBIS CO., LTD., Seoul (KR)

(72) Inventor: Su Hun Yang, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 92 days.

(21) Appl. No.: 17/090,691

(22) Filed: Nov. 5, 2020

(65) Prior Publication Data

US 2021/0143456 A1    May 13, 2021

(30) Foreign Application Priority Data

Nov. 8, 2019   (KR) .......................... 10-2019-0142821
Nov. 22, 2019  (KR) .......................... 10-2019-0151146

(51) Int. Cl.
| | | |
|---|---|---|
| *G01R 19/10* | (2006.01) | |
| *H01M 8/04537* | (2016.01) | |
| *G01R 31/40* | (2020.01) | |

(52) U.S. Cl.
CPC ........ *H01M 8/04559* (2013.01); *G01R 19/10* (2013.01); *G01R 31/40* (2013.01); *H01M 8/04552* (2013.01); *H01M 8/04567* (2013.01)

(58) Field of Classification Search
CPC .. G01R 31/36; G01R 31/392; G01R 31/3835; G01R 31/3648; G01R 31/367; G01R 31/3842; G01R 31/382; G01R 19/16542; G01R 19/0084; G01R 31/364; G01R 27/08; G01R 31/396; G01R 31/40; G01R 31/389; G01R 31/3644; G01R 19/10; B64D 2041/005; B64D 2221/00; B64D 2045/0085; B60K 1/04; H01M 2250/20;
(Continued)

(56) References Cited

U.S. PATENT DOCUMENTS

| | | | | |
|---|---|---|---|---|
| 7,834,635 | B2 * | 11/2010 | Oosawa .................. | B60L 58/15 324/434 |
| 8,164,341 | B2 * | 4/2012 | Jaeger .................. | G01R 31/396 320/120 |

(Continued)

FOREIGN PATENT DOCUMENTS

| | | |
|---|---|---|
| JP | 2000-285945 A | 10/2000 |
| JP | 2003115305 A | 4/2003 |

(Continued)

OTHER PUBLICATIONS

Notice of Allowance issued in corresponding Korean Patent Application No. 10-2019-0151146 dated Jan. 25, 2022, with English translation.

(Continued)

*Primary Examiner* — Vinh P Nguyen
(74) *Attorney, Agent, or Firm* — Morgan, Lewis & Bockius LLP

(57) ABSTRACT

A system for sensing a fuel cell of a vehicle may include: an analog digital converter (ADC) configured to receive a voltage of a fuel cell stack; a calculation unit configured to calculate a total number of cells of the fuel cell stack; and a control unit configured to acquire a voltage per a unit cell of the fuel cell stack based on output values of the ADC and the calculation unit.

19 Claims, 13 Drawing Sheets

(58) Field of Classification Search
CPC ......... H01M 8/04552; H01M 8/04559; H01M 8/04567; H01M 8/04537; H01M 8/04; H01M 8/04544; H01M 8/04574; H01M 8/04649; H01M 8/04873; H01M 8/04798; H01M 8/04604; H01M 10/482; H01M 8/04858; H01M 16/003; H01M 8/0488; H01M 10/625; H01M 8/04589; H01M 8/04119; H01M 8/04671; H01M 10/4285; Y02E 60/50; Y02E 60/10; Y02T 90/40; Y02T 10/62; Y02T 10/72; Y02T 10/70; Y02T 10/64; Y02T 90/14; H02J 2300/30; H02J 3/381; B60L 58/30
See application file for complete search history.

(56) References Cited

U.S. PATENT DOCUMENTS

| | | | | |
|---|---|---|---|---|
| 8,305,084 | B2* | 11/2012 | Ishikawa | G01R 31/396 324/433 |
| 8,552,729 | B2* | 10/2013 | Sekizaki | H01M 10/482 324/426 |
| 8,564,325 | B2* | 10/2013 | Mizoguchi | G01R 35/00 324/762.08 |
| 8,896,315 | B1* | 11/2014 | Davies | H02J 7/0016 320/120 |
| 9,157,939 | B2* | 10/2015 | Kain | G01R 19/16542 |
| 9,300,155 | B2* | 3/2016 | Mizoguchi | H01M 10/482 |
| 9,935,324 | B2* | 4/2018 | Ishikawa | H01M 8/04552 |
| 9,960,610 | B2* | 5/2018 | Tamura | G01R 31/396 |
| 10,983,172 | B2* | 4/2021 | Fifield | G01R 31/3835 |
| 2005/0110464 | A1* | 5/2005 | Baker | G01R 31/396 320/134 |
| 2009/0295329 | A1* | 12/2009 | Yugou | B60L 58/14 320/116 |

FOREIGN PATENT DOCUMENTS

| | | |
|---|---|---|
| JP | 2008021611 A | 1/2008 |
| JP | 2012196066 A | 10/2012 |
| JP | 2019-106706 A | 6/2019 |
| KR | 10-2001-0005545 A1 | 1/2001 |
| KR | 20040111144 A | 12/2004 |
| KR | 2009-0063951 A | 6/2009 |
| KR | 10-1039673 B1 | 6/2011 |
| KR | 101140349 B1 | 5/2012 |
| KR | 10-2013-0063406 A | 6/2013 |
| KR | 101504274 | 3/2015 |
| KR | 101897077 B1 | 9/2018 |
| KR | 101945427 B1 | 4/2019 |

OTHER PUBLICATIONS

Korean Office Action for Korean Application No. 10-2019-0151146 dated Feb. 8, 2021 (4 pgs).
Korean Office Action for Korean Application No. 10-2019-0142821 dated Dec. 4, 2020 (5 pgs).

* cited by examiner

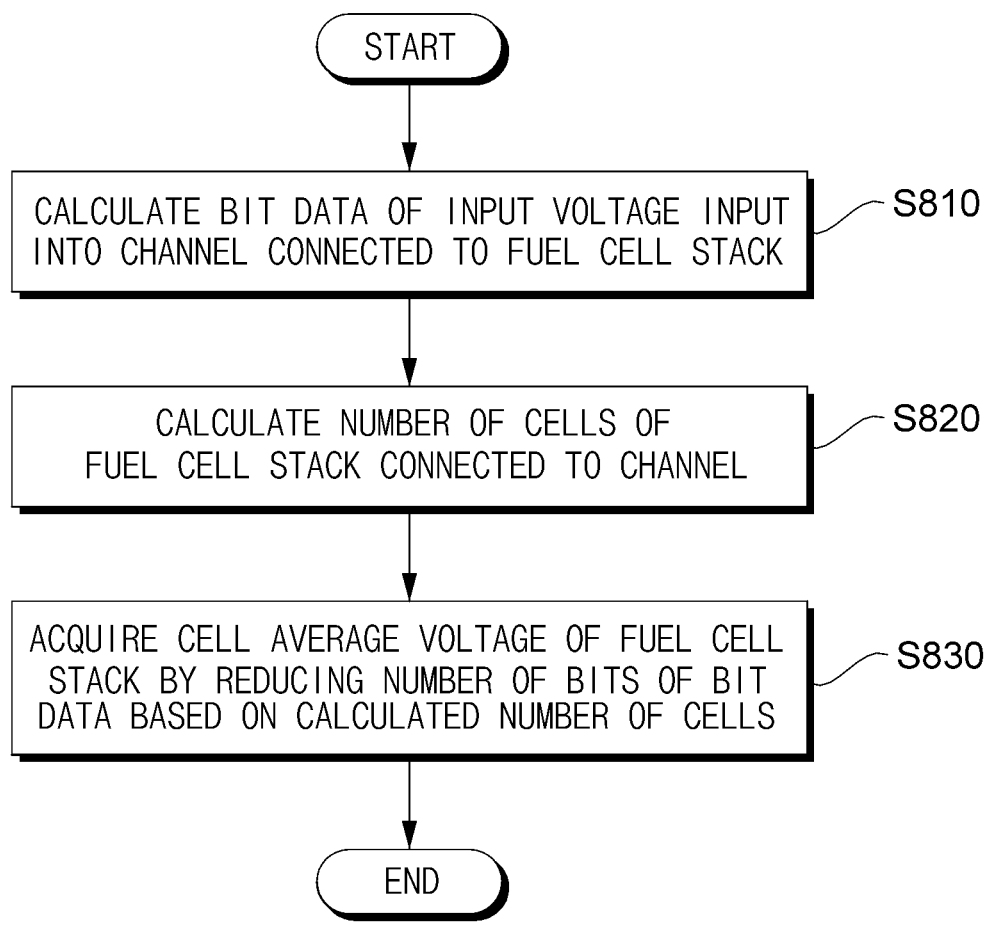

SYSTEM AND METHOD FOR SENSING FUEL CELL OF VEHICLE

CROSS-REFERENCE TO RELATED APPLICATION

This application claims priority to and the benefit of Korean Patent Application No. 10-2019-0142821 filed on Nov. 8, 2019, and No. 10-2019-0151146 filed on Nov. 22, 2019, the entire contents of which are incorporated herein by reference.

TECHNICAL FIELD

The present disclosure relates to a system and a method for sensing a fuel cell of a vehicle.

BACKGROUND

Vehicles using internal combustion engines that use gasoline or heavy oil as a main fuel have a serious impact on pollution, such as air pollution. Therefore, in recent years, in order to reduce the pollution generation, a lot of efforts are exerted into the development of electric vehicles or hybrid vehicles.

Among the electric vehicles, a fuel cell electric vehicle (FCEV) is drive by a fuel cell stack configured by connecting a plurality of fuel cells in series.

In the case of the fuel cell stack, any one cell constituting the fuel cell stack may have an output voltage of up to 1 V and a total output voltage may be controlled according to the number of fuel cells.

In order to control a power production amount of the fuel cell stack, inflow amounts of hydrogen and oxygen are controlled. In addition, for the state analysis of the fuel cell stack, an output voltage, an output current, and an output temperature are measured.

SUMMARY

The present disclosure provides a system for sensing a fuel cell of a vehicle, which is capable of measuring a total output voltage and a cell average voltage of a fuel cell stack without a separate arithmetic semiconductor.

The present disclosure provides a system and a method for sensing a fuel cell of a vehicle, in which fuel cell voltage sensing accuracy is enhanced.

An exemplary embodiment of the present disclosure provides a system for sensing a fuel cell of a vehicle, including: an ADC receiving a voltage of a fuel cell stack; a calculation unit calculating the total number of cells of the fuel cell stack; and a control unit acquiring a voltage per unit cell of the fuel cell stack based on output values of the ADC and the calculation unit.

The system may further include: a resistor array unit connected to both stages of the fuel cell stack; and a switch array unit changing the number of resistors connected to the fuel cell stack by performing a switching operation based on the calculated total number of cells so that the number of resistors of the resistor array unit connected to both stages of the fuel cell stack corresponds to the total number of cells of the fuel cell stack.

The calculation unit may receive a voltage from a channel connected to a unit cell of the fuel cell stack or connected to a multi-cell in which at least two are connected in series and calculate the total number of cells of the fuel cell stack by using the received voltage.

The total number of resistors of the resistor array unit may be equal to the number of sensible cells of the channel.

The switch array unit may include switches of a number equal to or smaller than the total number of resistors of the resistor array unit.

The switch array unit may include a plurality of switches connected to each other in parallel, in which one stage is connected to a positive voltage stage of the fuel cell stack and the other stage is connected to one stage of each corresponding resistor of the resistor array unit.

The switch array unit may include a plurality of switches connected to each other in series and connected to both stages of each corresponding resistor of the resistor array unit in parallel, and in the plurality of switches, both-end switches may be connected to both stages of the fuel cell stack, respectively.

The ADC may measure at least one resistor voltage of the resistor array unit, and the control unit may acquire the voltage per unit cell of the fuel cell stack through the measured resistor voltage.

The control unit may compare the resistor voltage and the voltage input into the channel connected to the fuel cell stack to determine whether the cell of the fuel cell stack is abnormal.

Another exemplary embodiment of the present disclosure provides a method for sensing a fuel cell of a vehicle, including: a voltage input step of receiving a voltage of a fuel cell stack; a calculation step of calculating the total number of cells of the fuel cell stack based on the input voltage; and a switch operation step of performing a switching operation based on the calculated total number of cells to change the number of resistors connected to both stages of the fuel cell stack in series.

The method may further include a resistor voltage measuring step of measuring at least one resistor voltage when the number of resistors connected to both stages of the fuel cell stack in series is changed to be equal to the calculated total number of cell.

The ADC may be a variable ADC that converts the input voltage input into the channel connected to the fuel cell stack into bit data.

The control unit may control the change of the resolution of the variable ADC according to the number of cells of the fuel cell stack connected to the channel.

The control unit may change the resolution of the variable ADC into N (N is an integer of 4 or more) bits when the number of cells of the fuel cell stack connected to the channel is 1, and the variable ADC may convert the input voltage into N-bit data.

The control unit may change the resolution of the variable ADC into N+A bits when the number of cells of the fuel cell stack connected to the channel is 2 or more ($2^4$, A is an integer of 1 or more), and the variable ADC may convert the input voltage into N+A-bit data.

The control unit may acquire N-bit valid data by removing lower A bits from the N+A bit data and acquire a cell average voltage of the fuel cell stack through the N-bit valid data.

The variable ADC may include a comparator receiving the input voltage from the channel connected to the fuel cell stack, an SAR logic storing an output of the comparator sequentially from most significant bit (MSB) of a bit register as a cycle is performed, and a DAC converting an output digital signal of the SAR logic into an analog voltage and transmitting the analog voltage to the comparator.

The variable ADC may be an SD-ADC in which an OSR is varied according to the number of cells of the fuel cell stack connected to the channel and a resolution is thus changed.

The variable ADC may vary the corresponding resolution to a resolution to measure all channels according to the maximum number of cells of the fuel cell stack connectable to the channel.

The control unit may set a register value disposed for each channel according to the number of cells of the fuel cell stack connected to the channel and change the resolution of the variable ADC by using the set register value.

According to an exemplary embodiment of the present disclosure, by a system for sensing a fuel cell of a vehicle, since a separate arithmetic semiconductor for computing an average output voltage of a unit cell is not required, a circuit is simplified.

A sensing data acquisition time is reduced through deletion of an additional computation time.

A separate high-voltage processing circuit is not required.

An ADC resolution is varied according to the number of unit cells connected to a channel to enhance fuel cell voltage sensing accuracy.

The foregoing summary is illustrative only and is not intended to be in any way limiting. In addition to the illustrative aspects, embodiments, and features described above, further aspects, embodiments, and features will become apparent by reference to the drawings and the following detailed description.

DRAWINGS

FIG. 12 is a flowchart of a method for sensing a fuel cell of a vehicle in one form of the present disclosure.

Figure 1:
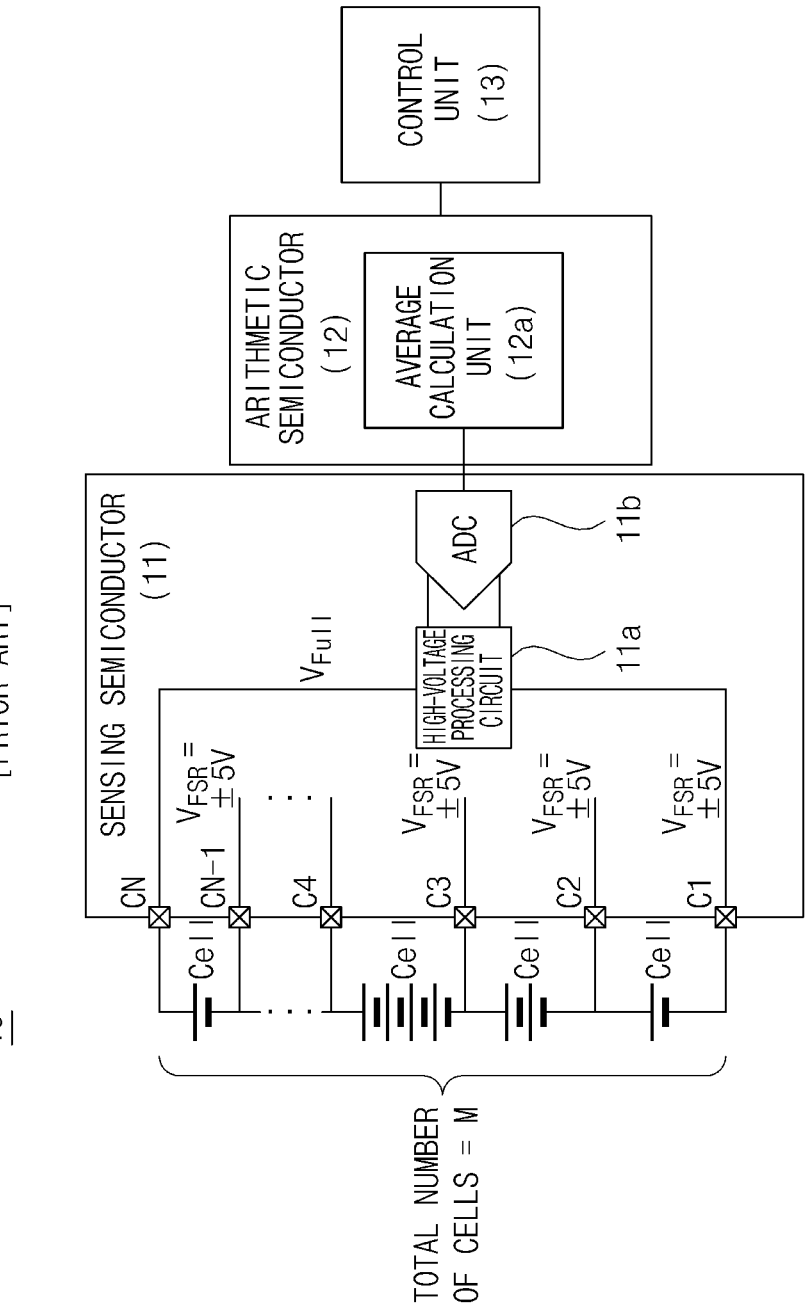
FIG. 1 is a configuration diagram of a battery cell average voltage measuring system in the related art.

It should be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Hereinafter, a preferred embodiment of the present disclosure will be described in detail with reference to the accompanying drawings. First, when reference numerals refer to components of each drawing, it is to be noted that although the same components are illustrated in different drawings, the same components are denoted by the same reference numerals as possible. Further, hereinafter, the preferred embodiment of the present disclosure will be described, but the technical spirit of the present disclosure is not limited thereto or restricted thereby and the embodiments can be modified and variously executed by those skilled in the art.

FIG. 1 illustrates an example of a fuel cell sensing system in the related art.

Referring to FIG. 1, a fuel cell sensing system 10 in the related art includes a sensing semiconductor 11 and an arithmetic semiconductor 12 and senses a total voltage of the fuel cell stack by using the same.

The total number of cells constituting the fuel cell stack is M (M is an integer of 2 or more) and the sensing semiconductor 11 senses individual voltages and the total voltage of the fuel cell through a plurality of channels (C1, C2, C3, C4, and CN−1 (CN)) (N is the integer of 2 or more).

A high-voltage processing circuit 11a measures the total voltage of the fuel cell stack and converts the measured total voltage into a digital value through an analog digital converter (ADC) 11b and transfers the digital value to the arithmetic semiconductor 12.

The arithmetic semiconductor 12 includes an average calculation unit 12a that receives total voltage information of the fuel cell stack from the sensing semiconductor 11 and divides the total voltage information by a total cell number M to compute an average output voltage per cell.

A control unit 13 controls a fuel cell output by the amounts of hydrogen and oxygen injected into the fuel cell by using the average output voltage per cell calculated by the average calculation unit 12a. However, the fuel cell sensing system 10 in the related art has a problem in that as the separate arithmetic semiconductor 12a and the high-voltage processing circuit 11a are provided, a circuit is complicated and a sensing data acquisition time for the fuel cell increases due to an additional computation time of the arithmetic semiconductor 12.

Figure 2:
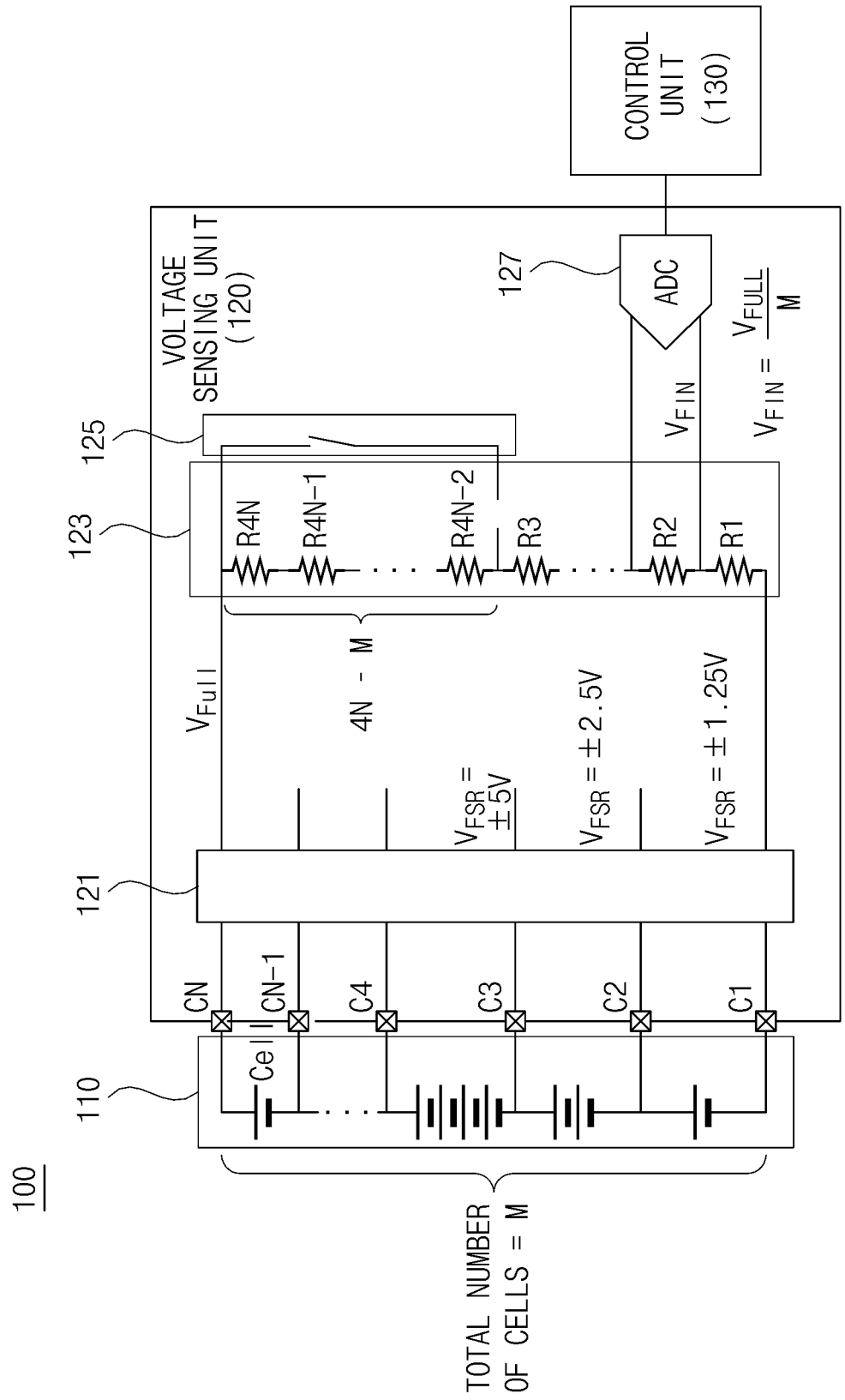
FIG. 2 is a configuration diagram of a system for sensing a fuel cell of a vehicle in one form of the present disclosure.

FIG. 2 is a configuration diagram of a system for sensing a fuel cell of a vehicle in some forms of the present disclosure.

Referring to FIG. 2, the system 100 for sensing a fuel cell of a vehicle in some forms of the present disclosure includes a fuel cell stack 110, a voltage sensing unit 120, and a control unit 130.

The fuel cell stack 110 may be configured by connecting a plurality of battery cells in series. The total number of the plurality of battery cells may be M (M is an integer of 2 or more).

In the plurality of battery cells, voltage sensing may be made for each unit cell. In the plurality of battery cells, two or more battery cells are combined to make the voltage sensing for each of multiple cells.

The voltage sensing unit 120 may detect an average voltage for each unit cell of the fuel cell stack 110. To this end, the voltage sensing unit 120 may include a calculation unit 121, a resistor array unit 123, a switch array unit 125, and an ADC 127.

The calculation unit 121 may receive a voltage through a channel connected to the unit cell or multiple cells of the fuel cell stack 110. Here, the number of channels may be N.

In an exemplary embodiment, a first channel C1 may be connected to a negative voltage stage of a lowest unit cell uc1 of the fuel cell stack 110.

A second channel C2 may be connected between a negative voltage stage of a lower multi-cell mc1 of the fuel cell stack 110 and a positive voltage stage of the lowest unit cell uc1.

A third channel C3 may be connected between the negative voltage stage of an upper multi-cell mc2 of the fuel cell stack 110 and the negative voltage stage of the lower multi-cell mc1.

An N−1-th channel CN−1 may be connected between the negative voltage stage of a top unit cell uc2 of the fuel cell stack 110 and the positive voltage stage of the upper multi-cell mc2.

An N-th channel CN may be connected to the positive voltage stage of the top unit cell uc2 of the fuel cell stack 110.

The number of cells which may be sensed through N channels may be 4N or 8N. Hereinafter, it will be described that the number of sensible cells is 4N.

A channel-specific voltage input range may be differently set. A voltage input range VFSR according to the first channel C1 and the second channel C2 may be ±1.25 V. The voltage input range VFSR according to the second channel C2 and the third channel C3 may be ±2.5 V. The voltage input range VFSR according to the third channel C3 and the fourth channel C4 may be ±5 V.

The calculation unit 121 may further include a circuit that may vary an input range for each channel. Therefore, channel-specific voltage measurement accuracy may be increased.

The calculation unit 121 may further include a register allocated for each channel. The input range set for each channel may be stored in the register. The calculation unit 121 may calculate the number of cells connected to each channel through the set input range. Therefore, the calculation unit 121 may calculate the total cell number of the fuel cell stack 110.

The resistor array unit 123 may include a plurality of resistors which is connected to each other in series. A lowest resistor R1 of the resistor array unit 123 may be connected to a lowest stage of the fuel cell stack 110 and a top resistor R4N−M may be connected to a top (positive voltage stage) of the fuel cell stack 110. The resistor array unit 123 may be constituted by 4N resistors corresponding to the maximum sensible channel number.

In the resistor array unit 123, the number of resistors connected to the fuel cell stack 110 through a switching operation of the switch array unit 125 may be varied. In the resistor array unit 123, resistors of a number corresponding to the total number of cells of the fuel cell stack 110 may be connected in series by the switch array unit 125. That is, in the resistor array unit 123, when the total number of cells of the fuel cell stack 110 is M, an M-th resistor from a bottom resistor R1 may be connected to the top of the fuel cell stack 110 by the switch array unit 125. In this case, in the resistor array unit 123, 4N−M resistors may be disconnected from the fuel cell stack 110. Further, a voltage per unit cell of the fuel cell stack 110 is applied to each resistor of the resistor array unit 123. Any one resistor voltage of the resistor array unit 123 may be detected through the ADC 127 and transferred to the control unit 130.

When the total cell number of the fuel cell stack 110 is calculated by the calculation unit 121, the switch array unit 125 may perform the switching operation based on the total cell number. The switch array unit 125 may connect the M-th resistor from the bottom resistor of the resistor array unit 123 and the top of the fuel cell stack 110.

The ADC 127 may measure any one resistor both-stage voltage of the resistor array unit 123. The ADC 127 may measure the voltage of a first node from the bottom (negative voltage stage) of the fuel cell stack 110 and measure the average voltage per unit cell, and transfer the measured average voltage per unit cell to the control unit 130.

The control unit 130 may receive the average voltage per unit cell from the voltage sensing unit 120. The control unit 130 is capable of performing fuel and air supply controlling for the fuel cell stack 110 by using average voltage information per unit cell.

Figure 3:
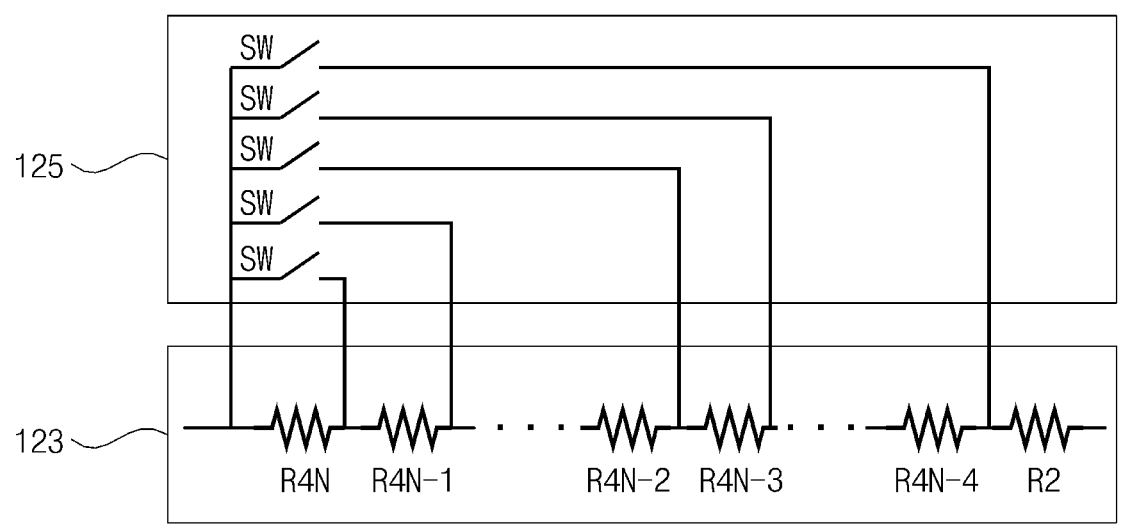
FIG. 3 is a diagram illustrating an exemplary embodiment of a switch array of FIG. 2.

FIG. 3 is a diagram illustrating an exemplary embodiment of a switch array unit of FIG. 2.

Referring to FIG. 3, the switch array unit 125 may include a plurality of switches SW. One stage of each of the plurality of switches SW may be connected to the top of the fuel cell stack 110. The other stage of each of the plurality of switches SW may be connected to a node between corresponding resistors of the resistor array unit 123.

In an exemplary embodiment, in the switch array unit 125, when M which is the total cell number of the fuel cell stack 110 is 4N, all switches may be controlled to be turned off. In this case, 4N resistors of the resistor array unit 123 may be connected to the fuel cell stack 110 in series.

In an exemplary embodiment, in the switch array unit 125, when M which is the total cell number of the fuel cell stack 110 is 4N−1, the switch SW connected between the resistor R4N and the resistor R4N−1 may be turned on. In this case, 4N−1 resistors of the resistor array unit 123 may be connected to the fuel cell stack 110 in series.

Figure 4:
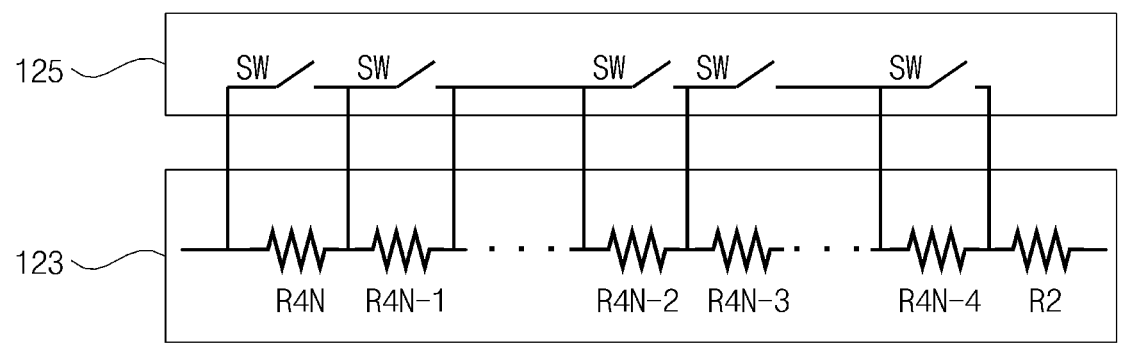
FIG. 4 is a diagram illustrating another exemplary embodiment of the switch array of FIG. 2.

FIG. 4 is a diagram illustrating another exemplary embodiment of the switch array unit of FIG. 2.

Referring to FIG. 4, the switch array unit 125 may include the plurality of switches SW connected to each other in series. Among the plurality of switches SW, one stage of the top switch may be connected to the top of the fuel cell stack 110 and the other stage may be connected between the top resistor R4N and the resistor R4N−1. Among the plurality of switches SW, the remaining switches may be connected to both stages of the corresponding resistor.

In an exemplary embodiment, in the switch array unit 125, when M which is the total cell number of the fuel cell stack 110 is 4N, all switches may be controlled to be turned off. In this case, 4N resistors of the resistor array unit 123 may be connected to the fuel cell stack 110 in series.

In an exemplary embodiment, in the switch array unit 125, when M which is the total cell number of the fuel cell stack 110 is 4N−1, the switch SW connected to both stages of the resistor R4N may be turned on. In this case, 4N−1 resistors of the resistor array unit 123 may be connected to the fuel cell stack 110 in series.

Figure 5:
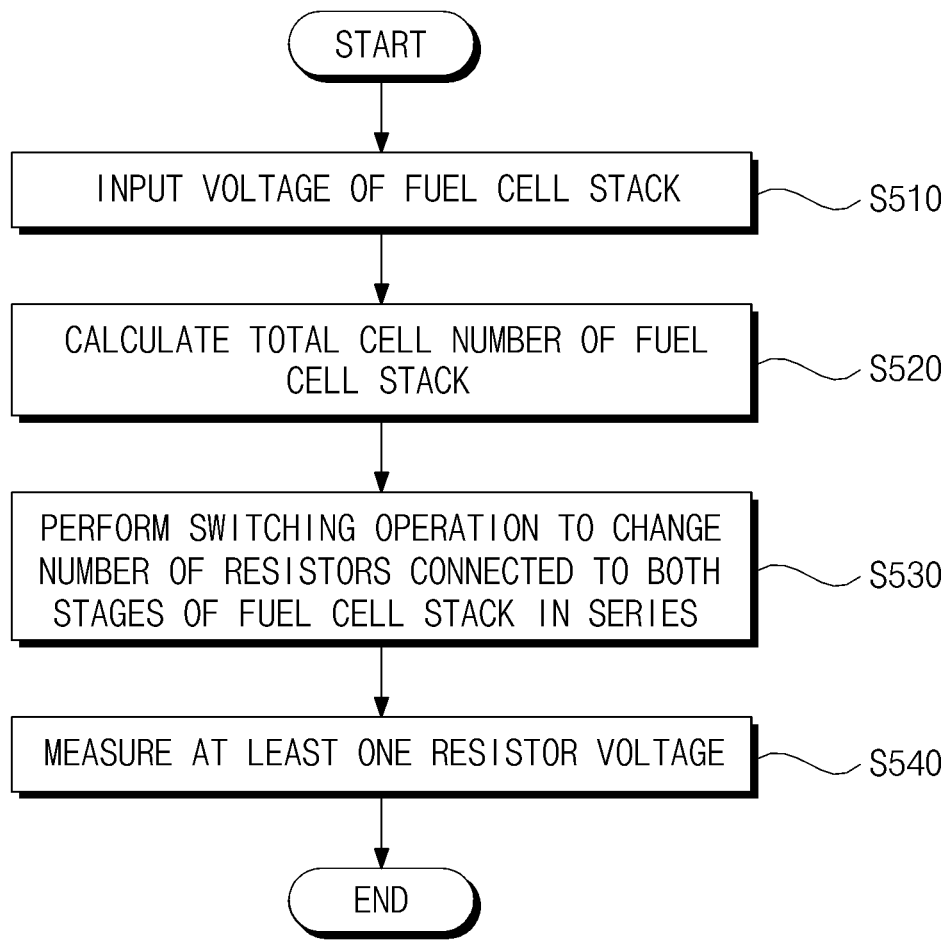
FIG. 5 is a flowchart of a method for sensing a fuel cell of a vehicle in one form of the present disclosure.

FIG. 5 is a flowchart of a method for sensing a fuel cell of a vehicle in some forms of the present disclosure.

Referring to FIGS. 2 and 5, a method for sensing a fuel cell of a vehicle in some forms of the present disclosure may include a voltage input step (S510), a calculation step (S520), a switch operation step (S530), and a resistor voltage measurement step (S540).

In the voltage input step (S510), the calculation unit 121 may receive the voltage of the fuel cell stack 110 through the channel. The input voltage includes a unit cell voltage and a multi-cell voltage of the fuel cell stack 110.

In the calculation step (S520), the calculation unit 121 may calculate the total cell number of the fuel cell stack 110 based on the input voltage.

In the switch operation step (S530), the switch array unit 125 performs the switching operation based on the calculated total cell number to change the number of resistors connected to both stages of the fuel cell stack 110 in series. The number of resistors is changed to be equal to the calculated total cell number.

In the resistor voltage measurement step (S540), when the number of resistors connected to both stages of the fuel cell stack 110 in series is changed to be equal to the calculated total cell number, the ADC 127 may measure at least one resistor voltage.

The voltage measured in at least one resistor may be equal to the average output voltage per unit cell.

Figure 6:
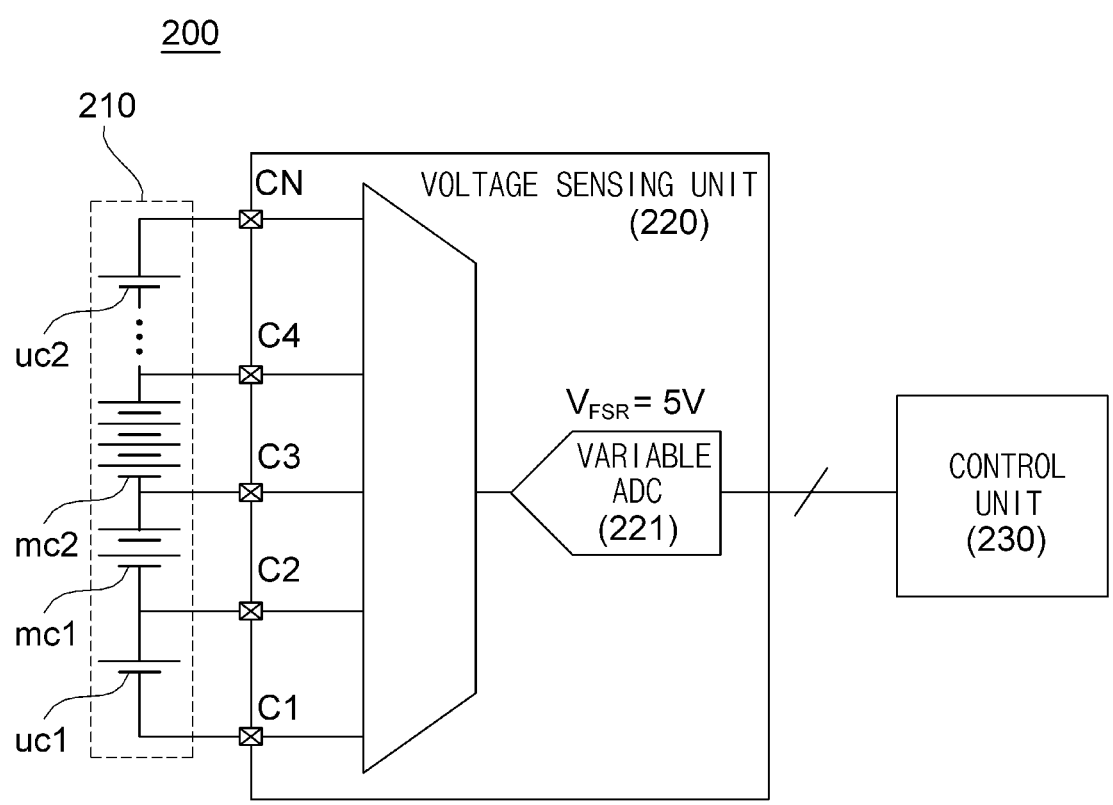
FIG. 6 is a configuration diagram of the system for sensing a fuel cell of a vehicle in one form of the present disclosure.

FIG. 6 is a configuration diagram of the system for sensing a fuel cell of a vehicle in some forms of the present disclosure.

Referring to FIG. 6, a system 200 for sensing a fuel cell of a vehicle in some forms of the present disclosure includes a fuel cell stack 210, a voltage sensing unit 220, and a control unit 230.

The fuel cell stack 210 may be constituted by a plurality of cells connected to each other in series. In the fuel cell stack 210, different number of cells may be voltage-sensed for each channel. In an exemplary embodiment, the fuel cell stack 210 may include a bottom unit cell uc1 constituted by one cell, a lower multi-cell mc1 constituted by two cells, an upper multi-cell mc2 constituted by four cells, and a top unit cell uc2.

The voltage sensing unit 220 may receive the voltage of the fuel cell stack 210 through a plurality of channels (C1, C2, C3, C4, CN).

The voltage sensing unit 220 may receive the voltage of the bottom unit cell uc1, the voltage of the lower multi-cell mc1, the voltage of the upper multi-cell mc2, and the voltage of the top unit cell uc2 for each channel.

The voltage sensing unit 220 may include a variable ADC 221 that converts the input voltage into bit data.

The variable ADC 221 may be a 4-bit ADC that converts the input voltage into 4-bit data. Further, the variable ADC 221 may be changed to a 6-bit ADC for enhancing detection accuracy for the input voltage. The variable ADC 221 may be changed to have a resolution of larger 14 bits or more as necessary.

Meanwhile, the variable ADC 221 may be configured as another example except for the aforementioned configuration. When the resolution is not varied according to the number of cells per channel and the maximum number of cells sensible per channel is A, the variable ADC 221 according to another exemplary embodiment may operate with a resolution to measure all channels based on the resolution required for the maximum cell number A. The resolution to measure all channels may be calculated by N+$\log_2$(A) bits. After voltage sensing for all channels is made in the variable ADC 221, the control unit 230 may acquire the channel average voltage by acquiring N-bit resolution required per one cell from an MSB.

In an exemplary embodiment, when A which is the maximum number of cells sensible per channel is 4, the variable ADC 221 may operate with a 6-bit resolution. The variable ADC 221 may measure the voltage of all channels with the 6-bit resolution.

The control unit 230 may change the resolution of the variable ADC 221 by considering the input voltage for each channel or the number of cells of the fuel cell stack 210 connected per channel. Here, the system 200 for sensing a fuel cell of a vehicle in some forms of the present disclosure may further include a calculation unit (corresponding to the calculation unit 121 of FIG. 2) (not illustrated) calculating the total cell number of the fuel cell stack 210. The control unit 230 may calculate the average voltage of the unit cell of the fuel cell stack 210 by using the bit data converted by the variable ADC 221.

In an exemplary embodiment, the control unit 230 may set a register value disposed for each channel according to the number of cells per channel. The control unit 230 may control the variable ADC 221 by using the set register value. When the variable ADC 221 uses an SAR logic 221b, the control unit 230 may determine an SAR cycle number. Further, when the variable ADC 221 is a sigma delta (SD)-ADC (see FIG. 13), the control unit 230 may adjust an OSR.

Table 1 below shows an example of the register value.

TABLE 1

| Register (memory) map | AD[0] | AD[1] | Number of cells per channel |
|---|---|---|---|
| Ch1 | 0 | 0 | unused |
| Ch2 | 0 | 1 | 1 |
| Ch3 | 1 | 0 | 2 |
| Ch4 | 1 | 1 | 4 |
| Ch5 | 1 | 1 | 4 |
| . . . | | | |

Figure 7:
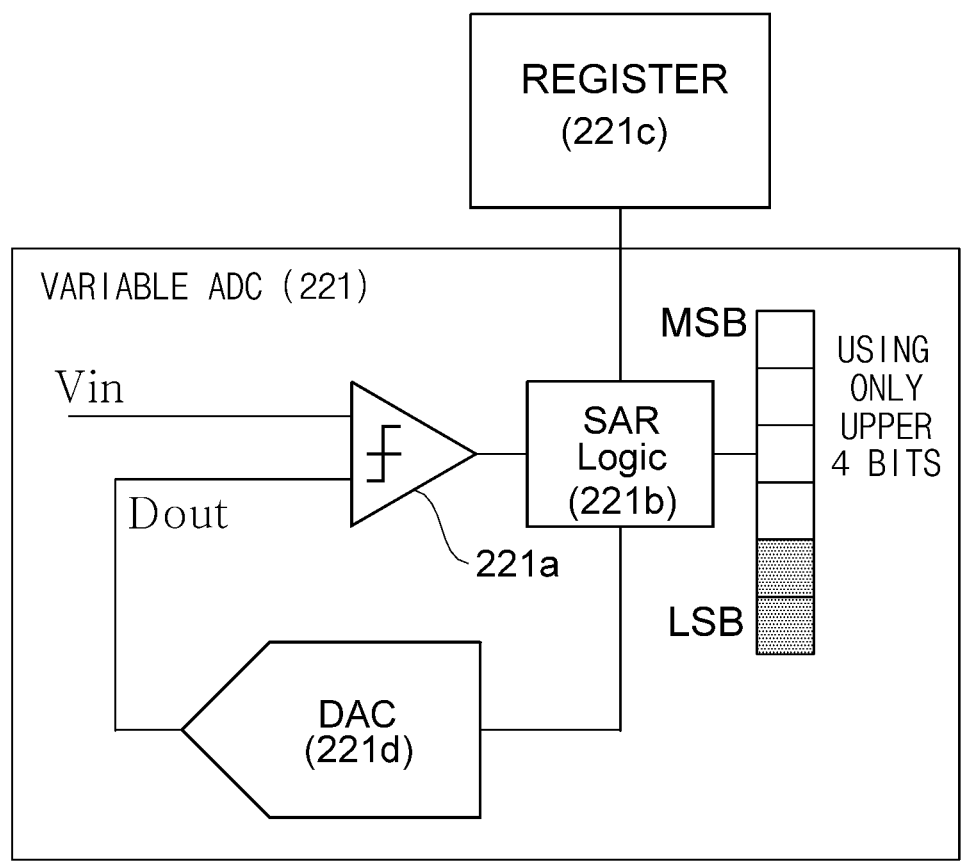
FIG. 7 is a diagram for describing an additional configuration of the system for sensing a fuel cell of a vehicle in one form of the present disclosure.

FIG. 7 is a diagram for describing an additional configuration of the system for sensing a fuel cell of a vehicle in some forms of the present disclosure.

Referring to FIG. 7, in an exemplary embodiment, the variable ADC 221 may include a comparator 221a, a successive approximation register (SAR) logic 221b, a register 221c, and a digital analog converter (DAC) 221d.

The comparator 221a compares an input voltage Vin input through the channel and an output voltage Dout of the DAC 221c. The comparator 221a outputs which voltage value of the input voltage Vin and the output voltage Dout is larger as a voltage level. The comparator 221a outputs a high voltage level when the input voltage Vin is larger than the output voltage Dout. The comparator 221a outputs a low voltage level when the input voltage Vin is smaller than the output voltage Dout.

The SAR logic 221b determines a comparison result as a data bit value sequentially from a most significant bit (MSB) every cycle.

In an exemplary embodiment, when the SAR logic 221b acquires the bit data for the voltage of the unit cell in which one cell is connected to one channel, four cycles may be performed by the control of the control unit 230. In this case, the SAR logic 221b may acquire 4-bit data.

In an exemplary embodiment, when the SAR logic 221b acquires the bit data for the voltage of the multi-cell in which two cells are connected to one channel, five cycles may be performed by the control of the control unit 230. In this case, the SAR logic 221b may acquire 5-bit data.

In an exemplary embodiment, when the SAR logic 221b acquires the bit data for the voltage of the multi-cell in which four cells are connected to one channel, six cycles may be performed by the control of the control unit 230. In this case, the SAR logic 221b may acquire 6-bit data. Therefore, an output resolution of the SAR logic 221b may be varied.

The register 221c may receive and store the number of cells of the fuel cell stack 210 connected for each channel from a separate controller (not illustrated). The number of cells for each channel stored in the register 221c may be used for controlling the number of cycles of the SAR logic 221b.

The DAC 221d may convert the bit data output from the SAR logic 221b into an analog voltage and output the analog voltage. The DAC 221d may transmit the output voltage Dout to an input stage of the comparator 221a.

Figure 8:
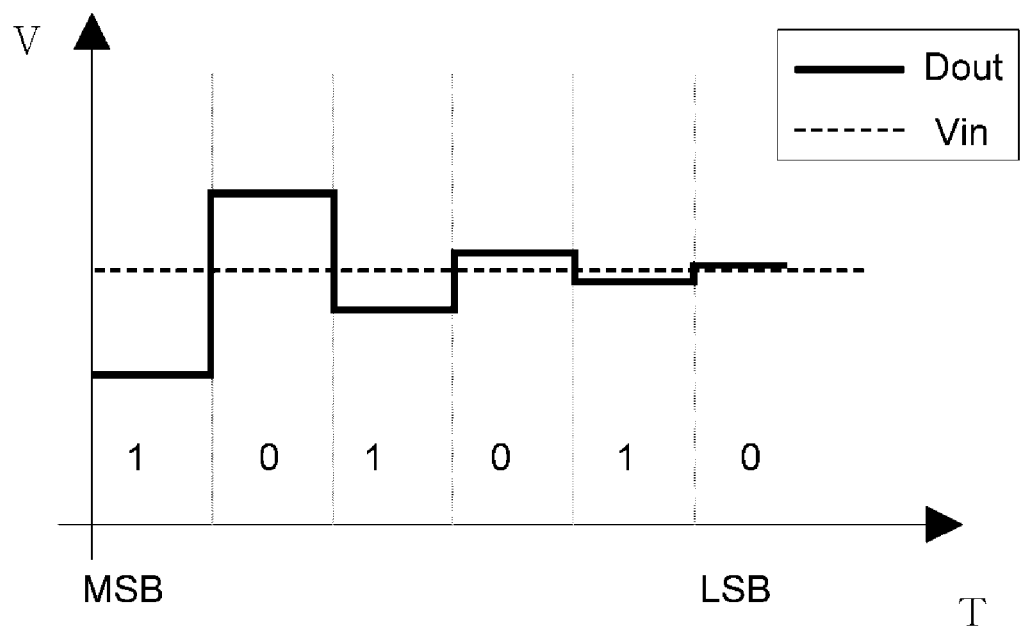
FIG. 8 is a diagram for describing 6-bit data conversion of a fuel cell voltage.

FIG. 8 is a diagram for describing 6-bit data conversion of a fuel cell voltage.

Referring to FIG. 8, when one cycle is performed in the SAR logic 221b, if the input voltage Vin is more than the output voltage Dout of the DAC 221d according to a comparison result of the comparator 221a, the SAR logic 221b may store a 1-bit value in the MSB register. Further, when two cycles are performed in the SAR logic 221b, if the input voltage Vin is less than the output voltage Dout of the DAC 221d according to the comparison result of the comparator 221a, the SAR logic 221b may store a 0-bit value in a bit register next to the MSB. Thereafter, when three to six cycles are performed in the SAR logic 221b, an appropriate bit value may be stored in up to a lowest significant bit (LSB) register based on the aforementioned contents.

Figure 9:
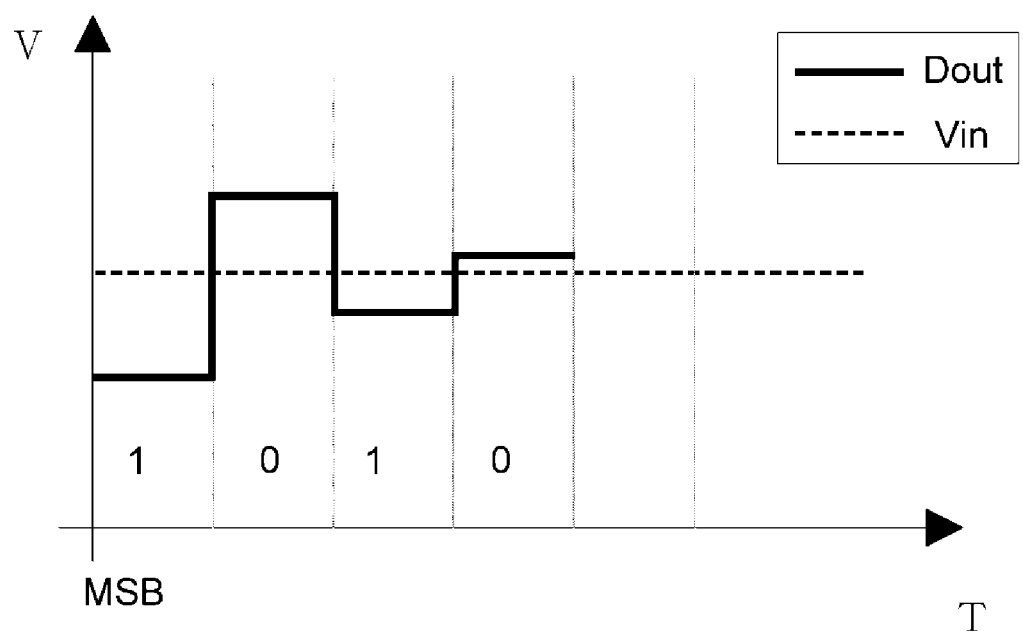
FIG. 9 is a diagram for describing 4-bit data conversion of the fuel cell voltage.

FIG. 9 is a diagram for describing 4-bit data conversion of the fuel cell voltage.

Referring to FIG. 9, when one cycle is performed in the SAR logic 221b, if the input voltage Vin exceeds the output voltage Dout of the DAC 221d according to a comparison result of the comparator 221a, the SAR logic 221b may store a 1-bit value in the MSB register. Further, when two cycles are performed in the SAR logic 221B, if the input voltage Vin is less than the output voltage Dout of the DAC 221d according to the comparison result of the comparator 221a, the SAR logic 221b may store 0-bit value in the bit register next to the MSB. Thereafter, when three to four cycles are performed in the SAR logic 221b, an appropriate bit value may be stored in up to a bit register except for two lower bits based on the aforementioned contents.

Figure 10:
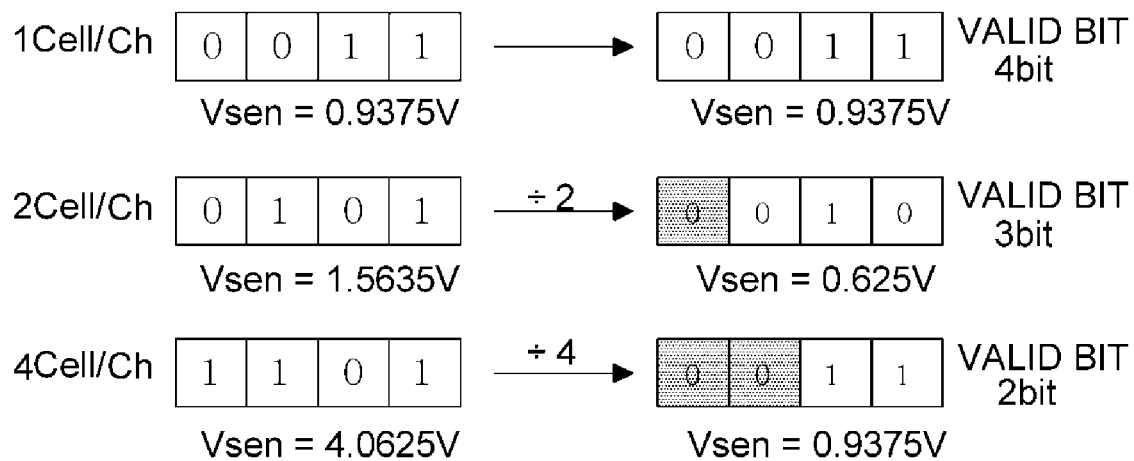
FIG. 10 is a diagram for describing a first cell average voltage calculating process of the fuel cell sensing system of FIG. 6.

FIG. 10 is a diagram for describing a first cell average voltage calculating process of the fuel cell sensing system of FIG. 6.

Referring to FIG. 10, an average value calculation process of the bit data acquired by the variable ADC 221 may be confirmed for the unit cell or multi-cell-specific voltage of the fuel cell stack 210.

In an exemplary embodiment, when a voltage Vsen of a unit cell (1 cell/ch) connected to the channel is detected as 0.9375 V, the detected voltage may be converted into 4-bit data of '0011' in the SAR logic 221b. In this case, when the number of unit cells per channel is one, the control unit 230 may determine 4-bit data of '0011' as the average voltage of the unit cell of the fuel cell stack 210 without an additional operation. Since the voltage per bit is approximately 0.3175 V and a decimal value of '0011' is 3, the control unit 230 may acquire 0.9375 V which is the average voltage of the unit cell by multiplying 0.3175 V which is the voltage per bit by 3.

In an exemplary embodiment, when the voltage Vsen of a multi-cell (2 cells/ch) constituted by two unit cells connected to the channel is detected as 1.5635 V, the detected voltage may be converted into 4-bit data of '0101' in the SAR logic 221b. In this case, since the number of multi-cells (2 cells/ch) connected to the channel is 2, the control unit 230 may perform a 1-bit right shift for 4-bit data of '0101' by considering the number of cells for each channel. Therefore, the control unit 230 may acquire 3-bit valid data of '010' except for the MSB which is an invalid bit. Therefore, the control unit 230 may acquire 0.625 V as the average voltage Vsen of the multi-cell (2 cells/ch).

In an exemplary embodiment, when the voltage Vsen of a multi-cell (4 cells/ch) constituted by four unit cells connected to the channel is detected as 4.0625 V, the detected voltage may be converted into 4-bit data of '1101' in the SAR logic 221b. In this case, since the number of multi-cells (4 cells/ch) connected to the channel is 4, the control unit 230 may perform the 2-bit right shift for 4-bit data of '1101' by considering the number of cells for each channel. Therefore, the control unit 230 may acquire 2-bit valid data of '11' except for two upper bits which are the invalid bit. Therefore, the control unit 230 may acquire 0.9375 V as the average voltage Vsen of the multi-cell (4 cells/ch).

Figure 11:
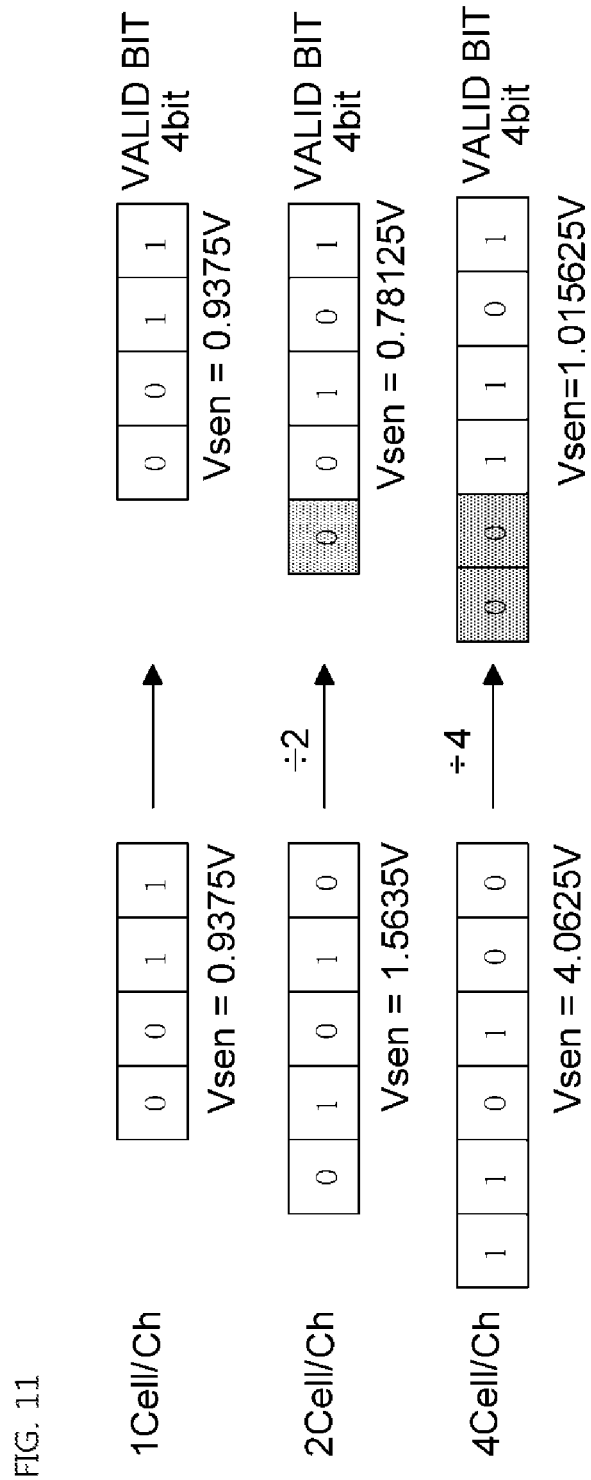
FIG. 11 is a diagram for describing a second cell average voltage calculating process of the fuel cell sensing system of FIG. 6.

FIG. 11 is a diagram for describing a second cell average voltage calculating process of the fuel cell sensing system of FIG. 6.

Referring to FIG. 11, an average value calculation process of the bit data acquired by the variable ADC 221 may be confirmed for the unit cell or multi-cell-specific voltage of the fuel cell stack 210.

In an exemplary embodiment, when a voltage Vsen of a unit cell (1 cell/ch) connected to the channel is detected as 0.9375 V, the detected voltage may be converted into '0011' N (N is an integer of 4 or more) bit data in the SAR logic 221b. Hereinafter, it will be described that N is 4. In this case, when the number of unit cells per channel is one, the control unit 230 may determine 4-bit data of '0011' as the average voltage of the unit cell of the fuel cell stack 210 without an additional operation. Since the voltage per bit is approximately 0.3175 V and a decimal value of '0011' is 3, the control unit 230 may acquire 0.9375 V which is the average voltage of the unit cell by multiplying 0.3175 V which is the voltage per bit by 3.

In an exemplary embodiment, when the voltage Vsen of a multi-cell (2 cells/ch) constituted by two unit cells connected to the channel is detected as 1.5635 V, the detected voltage may be converted into 4+A (A is an integer of 1 or more)-bit data of '01010' in the SAR logic 221b. In this case, since the number ($2^A$, A is 1) of multi-cells (2 cells/ch) connected to the channel is 2, the control unit 230 may remove the LSB for 5 (4+1)-bit data of '01010' by considering the number of cells for each channel. Therefore, the control unit 230 may acquire 4-bit valid data of '0101' except for the MSB which is an invalid bit. Therefore, the control unit 230 may acquire 0.78125 V as the average voltage Vsen of the multi-cell (2 cells/ch). This shows that detection accuracy of a voltage of 0.78125 V acquired during a second cell average voltage calculation process is increased as compared with a voltage of 0.625 V acquired during a first cell average voltage calculation process of FIG. 10.

In an exemplary embodiment, when the voltage Vsen of a multi-cell (4 cells/ch) constituted by four unit cells connected to the channel is detected as 4.0625 V, the detected voltage may be converted into 4+A-bit data of '110100' in the SAR logic 221b. In this case, since the number ($2^A$, A is 2) of multi-cells (4 cells/ch) connected to the channel is 4, the control unit 230 may remove two lower bits for 6 (4+2)-bit data of '1101000' by considering the number of cells for each channel. Therefore, the control unit 230 may acquire 4-bit valid data of '1101' except for two upper bits which are the invalid bit. Therefore, the control unit 230 may acquire 1.015625 V as the average voltage Vsen of the multi-cell (4 cells/ch). This shows that detection accuracy of a voltage of 1.015625 V acquired during a second cell average voltage calculation process is increased as compared with a voltage of 0.9375 V acquired during a first cell average voltage calculation process OF FIG. 10.

As such, when six cycles are performed in the SAR logic 221b, the input voltage may be converted into a bit data form by using only upper 4-bit data in total 6-bit data. In this case, there is an effect of a division operation without a separate right shift operation.

FIG. 12 is a flowchart of a method for sensing a fuel cell of a vehicle in some forms of the present disclosure.

Referring to FIG. 12, a method for sensing a fuel cell of a vehicle in some forms of the present disclosure may include a bit data calculating step (S810), a cell number calculating step (S820), and a cell average voltage acquiring step (S830).

In the bit data calculating step (S810), the variable ADC 221 converts the input voltage input into the channel connected to the fuel cell stack 210 into the bit data.

In the cell number calculating step (S820), a calculation unit (not illustrated) calculates the number of cells of the fuel cell stack connected to the channel.

In the cell average voltage acquiring step (S830), the control unit 230 acquires a cell average voltage of the fuel cell stack 210 by reducing the number of bits of the bit data based on the calculated number of cells. The control unit 230 may change the resolution of the variable ADC 221 based on the number of cells calculated as above. The variable ADC 221 may convert the input voltage into 4-bit data to 6-bit data according to the changed resolution. The control unit 230 may determine a bit reduction number according to the calculated cell number and reduce the bit number of the bit data output from the variable ADC 221 through the determined bit reduction number.

FIG. 13 is a diagram illustrating another example of a variable ADC of the system for sensing a fuel cell of a vehicle in some forms of the present disclosure.

Referring to FIG. 13, the variable ADC 221 may be an SD-ADC. The variable ADC 221 may be configured to include a filter unit 221e and a modulation unit 221f.

Figure 13A:
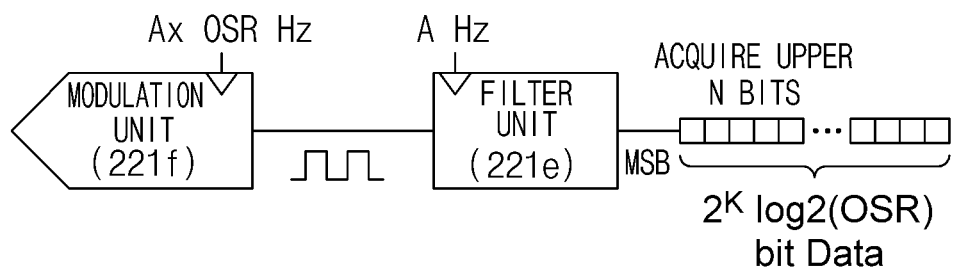
FIGS. 13A, 13B, 13C are diagrams illustrating another example of a variable ADC of the system for sensing a fuel cell of a vehicle in one form of the present disclosure.

In FIG. 13A, the filter unit 221e may filter a frequency (A HZ) of the input voltage and convert the filtered frequency into $2^K \cdot \log 2$ (OSR) bit data. Here, K may be an integer of 1 to 3. Oversampling rate (OSR) may be an index of 2. The OSR may be adjusted according to the number (N) of cells per channel. The adjusted OSR may vary an operation speed of the modulation unit 221f. The modulation unit 221f may change the resolution of the variable ADC 221 through the varied operation speed.

Figure 13B:
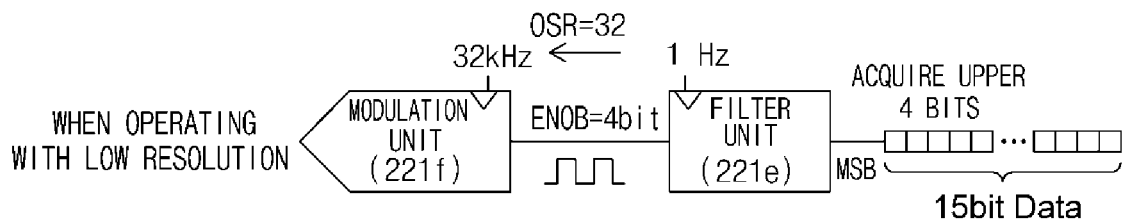

In FIG. 13B, the variable ADC 221 may operate with a low resolution when the number of cells per channel is 1. The input voltage may be converted into 15-bit data by the filter unit 221e. In this case, the OSR may be adjusted to 32.1 kHz which is the frequency of the input voltage may be modulated into a frequency of 32 kHz by the modulation unit 221f. The control unit 230 may acquire the cell average voltage by acquiring upper 4-bit data in 15-bit data.

Figure 13C:
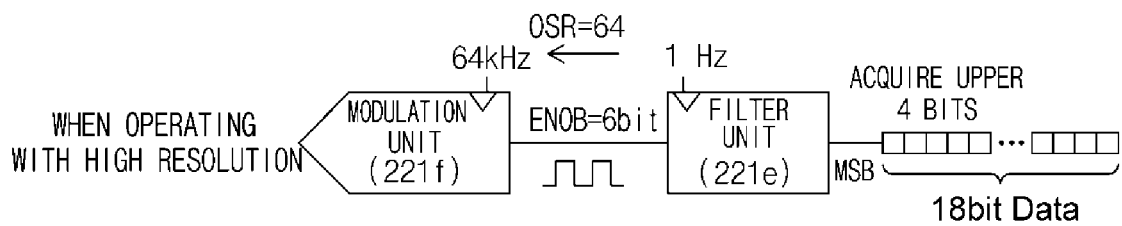

In FIG. 13C, the variable ADC 221 may operate with a high resolution when the number of cells per channel is 4.

The input voltage may be converted into 18-bit data by the filter unit 221e. In this case, the OSR may be adjusted to 64.1 kHz which is the frequency of the input voltage may be modulated into a frequency of 64 kHz by the modulation unit 221f. The control unit 230 may acquire the cell average voltage by acquiring upper 4-bit data in 18-bit data.

When the variable ADC 221 has the low resolution, power consumption is reduced and a sensing time is reduced.

Meanwhile, the embodiments according to the present disclosure may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the exemplary embodiments have been described and illustrated in the drawings and the specification. The exemplary embodiments were chosen and described in order to explain certain principles of the disclosure and their practical application, to thereby enable others skilled in the art to make and utilize various exemplary embodiments of the present disclosure, as well as various alternatives and modifications thereof. As is evident from the foregoing description, certain aspects of the present disclosure are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the disclosure are deemed to be covered by the disclosure which is limited only by the claims which follow.

What is claimed is:

1. A system for sensing a fuel cell stack of a vehicle, the system comprising:

an analog digital converter (ADC) configured to receive a voltage from the fuel cell stack and convert the voltage into bit data;

a calculation circuit configured to calculate a total number of cells of the fuel cell stack using a voltage input range of the fuel cell stack;

a control unit configured to acquire a voltage per unit cell of the fuel cell stack based on the bit data from the ADC and the total number of cells from the calculation circuit;

a resistor array connected to a negative voltage stage of a lowest unit cell and a positive voltage stage of a highest unit cell of the fuel cell stack; and a switch array configured to change a number of resistors connected to the fuel cell stack by performing a switching operation based on the calculated total number of cells so that the number of resistors of the resistor array connected to the negative voltage stage of the lowest unit cell and the positive voltage stage of the highest unit cell of the fuel cell stack corresponds to the total number of cells of the fuel cell stack.

2. The system of claim 1, wherein the calculation circuit is configured to:
receive a voltage from a channel connected to the unit cell of the fuel cell stack or connected to a multi-cell in which at least two cells are connected in series; and
calculate the total number of cells of the fuel cell stack by using the received voltage.

3. The system of claim 1, wherein a total number of resistors of the resistor array is equal to a number of sensible cells of a channel.

4. The system of claim 1, wherein the switch array includes a number of switches equal to or less than a total number of resistors of the resistor array.

5. The system of claim 4, wherein the switch array includes a plurality of switches connected to each other in parallel, wherein a first stage is connected to a positive voltage stage of the highest unit cell of the fuel cell stack and a second stage is connected to a node between each corresponding resistor of the resistor array.

6. The system of claim 4, wherein the switch array includes a plurality of switches connected to each other in series and connected to both nodes of each corresponding resistor of the resistor array in parallel, and
in the plurality of switches, both-end switches are connected to a node between each corresponding resistor of the resistor array, respectively.

7. The system of claim 1, wherein:
the ADC is configured to measure at least one resistor voltage of the resistor array, and
the control unit is configured to acquire the voltage per unit cell of the fuel cell stack through the measured resistor voltage received from the ADC.

8. The system of claim 7, wherein the control unit is configured to:
compare the resistor voltage with a voltage input into the channel connected to the fuel cell stack; and
determine whether the cell of the fuel cell stack is abnormal.

9. The system of claim 1, wherein the ADC is a variable ADC that is configured to convert an input voltage into bit data.

10. The system of claim 9, wherein the control unit is configured to:
control a change of a resolution of the variable ADC according to the number of cells of the fuel cell stack connected to a channel.

11. The system of claim 10, wherein the control unit is configured to:

change the resolution of the variable ADC into N bits when the number of cells of the fuel cell stack connected to the channel is 1, and the variable ADC is configured to convert the input voltage into N-bit data, wherein N is an integer of 4 or greater.

12. The system of claim 10, wherein the control unit is configured to:
change the resolution of the variable ADC into N+A bits when the number of cells of the fuel cell stack connected to the channel is 2 or greater (2A), wherein A is an integer of 1 or greater, and
the variable ADC is configured to convert the input voltage into N+A-bit data.

13. The system of claim 12, wherein the control unit is configured to:
acquire N-bit valid data by removing lower A bits from the N+A-bit data; and
acquire a cell average voltage of the fuel cell stack through the N-bit data.

14. The system of claim 9, wherein the variable ADC includes:
a comparator configured to receive the input voltage from a channel connected to the fuel cell stack, a successive approximation register (SAR) logic configured to store an output of the comparator sequentially from most significant bit (MSB) of a bit register per a cycle, and
a digital analog converter (DAC) configured to:
convert an output digital signal of the SAR logic into an analog voltage; and
transmit the analog voltage to the comparator.

15. The system of claim 9, wherein the variable ADC is a sigma delta (SD) ADC in which an oversampling rate (OSR) is varied according to the number of cells of the fuel cell stack connected to a channel and a resolution is thus changed.

16. The system of claim 9, wherein the variable ADC is configured to:
vary a corresponding resolution to a resolution; and
measure all channels according to a maximum number of cells of the fuel cell stack.

17. The system of claim 9, wherein the control unit is configured to:
set a register value disposed for each channel according to the number of cells of the fuel cell stack; and
change a resolution of the variable ADC by using the set register value.

18. A method for sensing a fuel cell stack of a vehicle, the method comprising:
receiving, by an analog digital converter (ADS), a voltage from a resistor array;
calculating, by a calculation circuit, a total number of cells of the fuel cell stack based on an input voltage; and
performing, by a switch array, a switching operation based on the calculated total number of cells to change a number of resistors connected to a negative voltage stage of a lowest unit cell and a positive voltage stage of a highest unit cell of the fuel cell stack in series.

19. The method of claim 18, wherein the method further comprises:
measuring, by the ADC, at least one resistor voltage when the number of resistors connected to the negative voltage stage of the lowest unit cell and the positive voltage stage of the highest unit cell of the fuel cell stack in series is changed to be equal to the calculated total number of cells.

* * * * *